(12) United States Patent
Bellman et al.

(10) Patent No.: US 10,680,192 B2
(45) Date of Patent: Jun. 9, 2020

(54) PHOTO-PATTERNABLE GATE DIELECTRICS FOR OFET

(71) Applicant: CORNING INCORPORATED, Corning, NY (US)

(72) Inventors: Robert Alan Bellman, Ithaca, NY (US); Mingqian He, Horseheads, NY (US); Timothy Edward Myers, Painted Post, NY (US); Weijun Niu, Painted Post, NY (US); David Neal Schissel, Painted Post, NY (US); Kristi Lynn Simonton, Erin, NY (US); Arthur Lawrence Wallace, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 16/223,645

(22) Filed: Dec. 18, 2018

(65) Prior Publication Data
US 2019/0115548 A1     Apr. 18, 2019

Related U.S. Application Data

(60) Continuation of application No. 15/667,138, filed on Aug. 2, 2017, now Pat. No. 10,186,673, which is a division of application No. 15/066,548, filed on Mar. 10, 2016, now Pat. No. 9,761,817.

(60) Provisional application No. 62/132,867, filed on Mar. 13, 2015.

(51) Int. Cl.
*H01L 51/05* (2006.01)
*H01L 51/10* (2006.01)
*H01L 51/00* (2006.01)

(52) U.S. Cl.
CPC ........ *H01L 51/0512* (2013.01); *H01L 51/052* (2013.01); *H01L 51/0516* (2013.01); *H01L 51/0525* (2013.01); *H01L 51/107* (2013.01); *H01L 51/0003* (2013.01)

(58) Field of Classification Search
CPC .............. H01L 51/0512; H01L 51/052; H01L 51/0516; H01L 51/0545
See application file for complete search history.

(56) References Cited

U.S. PATENT DOCUMENTS

| | | | |
|---|---|---|---|
| 7,666,511 B2 | 2/2010 | Ellison et al. | |
| 7,678,463 B2 | 3/2010 | Marks et al. | |
| 7,679,079 B1 | 3/2010 | Marks et al. | |
| 7,705,108 B2 | 4/2010 | He | |

(Continued)

FOREIGN PATENT DOCUMENTS

| | | |
|---|---|---|
| JP | 2009256414 A | 11/2009 |
| WO | 2007009889 A1 | 1/2007 |

OTHER PUBLICATIONS

Asandei et al; "CP2TICL Catalyzed Graft Copolymerization of Styrene and (Meth)Acrylates From the Epoxides of Glycidyl Methacrylate Copolymers"; Polymer Preprints, 2007, 48 (1), pp. 381-382.

(Continued)

*Primary Examiner* — Phat X Cao

(57) ABSTRACT

Articles utilizing polymeric dielectric materials for gate dielectrics and insulator materials are provided along with methods for making the articles. The articles are useful in electronics-based devices that utilize organic thin film transistors.

8 Claims, 3 Drawing Sheets

(56) References Cited

U.S. PATENT DOCUMENTS

| | | |
|---|---|---|
| 7,919,634 B2 | 4/2011 | He et al. |
| 8,158,543 B2 | 4/2012 | Dejneka et al. |
| 8,217,183 B2 | 7/2012 | He et al. |
| 8,278,346 B2 | 10/2012 | He et al. |
| 8,394,918 B2 | 3/2013 | He et al. |
| 8,431,502 B2 | 4/2013 | Dejneka et al. |
| 8,487,114 B2 | 7/2013 | He et al. |
| 8,586,492 B2 | 11/2013 | Barefoot et al. |
| 8,652,978 B2 | 2/2014 | Dejneka et al. |
| RE44,869 E | 4/2014 | Ellison |
| 8,796,165 B2 | 8/2014 | Ellison et al. |
| 8,846,855 B2 | 9/2014 | He et al. |
| 8,901,544 B2 | 12/2014 | He et al. |
| 8,916,066 B2 | 12/2014 | He et al. |
| 8,946,103 B2 | 2/2015 | Dejneka et al. |
| 8,969,226 B2 | 3/2015 | Dejneka et al. |
| 9,156,724 B2 | 10/2015 | Gross |
| 9,276,226 B2 | 3/2016 | Marks et al. |
| 9,290,413 B2 | 3/2016 | Dejneka et al. |
| 9,312,044 B2 | 4/2016 | He et al. |
| 9,346,703 B2 | 5/2016 | Bookbinder et al. |
| 2005/0279995 A1 | 12/2005 | Shin et al. |
| 2007/0161776 A1 | 7/2007 | He |
| 2008/0055521 A1* | 3/2008 | Mizutani .............. G02B 5/3016 349/96 |
| 2008/0224127 A1 | 9/2008 | Marks et al. |
| 2009/0002821 A1 | 1/2009 | Okano et al. |
| 2009/0134386 A1 | 5/2009 | Nakano et al. |
| 2009/0197048 A1 | 8/2009 | Amin et al. |
| 2010/0019237 A1 | 1/2010 | Marks et al. |
| 2010/0173165 A1 | 7/2010 | Marks et al. |
| 2011/0017287 A1 | 1/2011 | Borrelli et al. |
| 2011/0024729 A1 | 2/2011 | Marks et al. |
| 2011/0129665 A1 | 6/2011 | Botelho et al. |
| 2011/0175089 A1 | 6/2011 | Zheng et al. |
| 2011/0215334 A1 | 9/2011 | Quinn et al. |
| 2011/0240064 A1 | 10/2011 | Wales et al. |
| 2011/0266534 A1 | 11/2011 | Yan et al. |
| 2011/0267697 A1 | 11/2011 | Kohli et al. |
| 2011/0284849 A1 | 11/2011 | Marks et al. |
| 2012/0159991 A1 | 6/2012 | Dejneka et al. |
| 2012/0280368 A1 | 11/2012 | Garner et al. |
| 2013/0200345 A1 | 8/2013 | Usta et al. |
| 2014/0106172 A1 | 4/2014 | Dejneka et al. |
| 2014/0217389 A1 | 8/2014 | Kugler |
| 2015/0045560 A1 | 2/2015 | He et al. |
| 2015/0214496 A1 | 7/2015 | Du et al. |

OTHER PUBLICATIONS

Asandei et al; "Living Ring Opening Grafting Copolymerization of Cyclic Esters From Poly (Methyl Methacrylate-Co-Glycidyl Methacrylate"; Polymer Preprints, 2005, 46 (1), pp. 674-675.

International Search Report and Written Opinion PCT/US2016/021900 dated Aug. 9, 2016.

Wang et al. "Light response characteristics of organic thin-film transistors with and without a P(MMAGMA) modification layer", Semiconductor Science and Technology, IOP Publishing Ltd. GB., vol. 25 No. 11, 2010, p. 115009.

Bao et al; "Silsesquioxane Resins as High-Performance Solution Processible Dielectric Materials for Organic Transistor Applications." Advanced Functional Materials 2002 12(8): 526-531.

Chou et al; "Tuning Surface Properties in Photosensitive Polyimide. Material Design for High Performance Organic Thin-Film Transistors"; Journal of Materials Chemistry (2010), 20(26), 5474-5480.

Fahem et al; "Free Radical Fast Photo-Cured Gate Dielectric for Top-Gate Polymer Field Effect Transistors"; Organic Electronics 13 (2012) 1382-1385.

Garnier et al; "Molecular Engineering or Organic Semiconductors: Design of Self-Assembly Properties in Conjugated Thiophene Oligomers"; Journal of the Americal Chemical Society 1993; 115(19): 8716-8721.

Gelinck et al; "High-Performance All-Polymer Integrated Circuits"; Applied Physics Letters 2000 77(10): 1487-1489.

Halik et al; "High-Mobility Organic Thin-Film Transistors Based on $\alpha,\alpha'$—Didecyloligothiophenes"; Journal of Applied Physics 2003 93(5): 2977-2981.

Horowitz et al; "Field-Effect Transistor Made With a Sexithiophene Single Crystal"; Advanced Materials 1996 8(1): 52-54.

Jang et al; "Photocurable Polymer Gate Dielectrics for Cylindrical Organic Field-Effect Transistors With High Bending Stability"; Journal of Materials Chemistry (2012), 22(3), 1054-1060.

Kim et al; "All-Organic Thin-Film Transistors Using Photoacryl as a Gate Insulator"; Optical Materials 2003 21(1-3): 425-428.

Kim et al; "Photo-Curable Polymer Blend Dielectrics for Advancing Organic Field-Effect Transistor Applications"; Advanced Materials; 2010. 22, 4809-4813.

Krevelen; "Properties FO Polymers", Elsevier, 1990, 25 Pages.

Sirringhaus et al; "High-Resolution Inkjet Printing of All-Polymer Transistor Circuits." Science 2000 290(5499): 2123-2126.

* cited by examiner

PHOTO-PATTERNABLE GATE DIELECTRICS FOR OFET

CROSS REFERENCE TO RELATED APPLICATIONS

The present application claims the benefit of priority under 35 U.S.C. § 120 to U.S. Non-Provisional patent application Ser. No. 15/667,138, filed Aug. 2, 2017, which is a divisional application of Ser. No. 15/066,548, filed Mar. 10, 2016, which claims the benefit of priority under 35 U.S.C. § 119 to U.S. Provisional Patent Application No. 62/132,867, filed Mar. 13, 2015, the contents of all of which are relied upon and incorporated herein by reference in their entirety.

FIELD

Embodiments generally relate to polymeric compounds for use as dielectric materials in electronic devices and organic semiconductor devices comprising novel organic dielectric materials.

TECHNICAL BACKGROUND

There is a continued demand for thinner, lighter, and faster portable electronics devices. In striving to keep up with these demands, device makers are constantly looking for new materials that provide not only these qualities, but are also mechanically durable enough for the application and producible at a reasonable cost. Organic semiconductor and dielectric materials have attracted a great amount of attention in the research and commercial communities due to their advantages over inorganic materials, such as high mechanical flexibility, low manufacturing cost, and light weight.

One particular challenge for polymer transistors is to fabricate an ultrathin defect-free gate dielectric layer that also provides a high-quality interface with the adjacent semiconductive layer. This dielectric layer has to show high dielectric breakdown strength, very low electrical conductivity, very low interface and bulk trapping of carriers, and good stability. This challenge has been met for Si CMOS FET's through thermally-grown dielectrics. $SiO_2$ is robust, has high film integrity and has sufficiently high dielectric breakdown strength for practical applications. However, in the case of organic devices, there continues to be a need to develop organic containing gate dielectric systems for commercial applications, such as electronic papers, printed logic circuits and RFID tags etc. Such gate dielectric layers must be easy to fabricate conformally on a variety of substrates in both top-gate and bottom-gate configurations. They also need to exhibit high flexural strength, significant thermal stability, and environmental resistance.

It has been found that the functionality of organic-material based devices is highly dependent on the synergy of the organic materials used, meaning that often the various organic components need to be developed and optimized in tandem. For example, although there are numerous insulating polymer systems known, the search for a gate dielectric that can fulfill all of the above requirements is still not trivial. Furthermore, the gate dielectric polymer must be compatible with the overall designated processing scheme of polymer FETs. For example, its formation must not destroy earlier formed layers, while it itself has to survive subsequent solvent and thermal processing. Applicants have found that the unmet needs described are met by the polymers and devices described herein.

SUMMARY

A first aspect comprises an article comprising a substrate having a first surface and a second surface; an organic semiconductor layer; a gate, a source, and a drain electrode; and a dielectric layer; wherein the dielectric layer comprises a polymer:

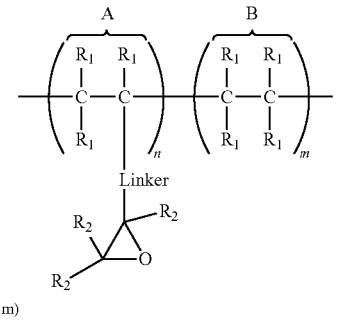

P(A)-Co-P(B) (n:m)

wherein A is an epoxide-containing monomer; B is second monomer; n is an integer of one or greater; m is an integer of one or greater; the ratio of n:m is from about 20:1 to about 1:20; and each $R_1$ and $R_2$ are independently, hydrogen, substituted or unsubstituted alkyl, substituted or unsubstituted aryl or heteroaryl, substituted or unsubstituted cycloalkyl, substituted or unsubstituted aralkyl, ester, alkoxy, thiol, thioalkyl, or halide; and Linker is a substituted or unsubstituted alkyl, substituted or unsubstituted aryl or heteroaryl, substituted or unsubstituted cycloalkyl, aralkyl, ester, ether, alkoxy, alkylthio, or thioalkyl. In some embodiments, the ratio of n:m is about 3:1 to 1:3 and each $R_1$ and $R_2$ are independently, hydrogen, substituted or unsubstituted alkyl, substituted or unsubstituted aryl or heteroaryl. In some embodiments, Linker is a substituted or unsubstituted alkyl or substituted or unsubstituted aryl or heteroaryl. In some embodiments, Linker is a substituted or unsubstituted cycloalkyl, aralkyl, ester, ether, alkoxy, alkylthio, or thioalkyl.

In some embodiments, the dielectric polymer has a dielectric breakdown of greater than 1 MV/cm, or is photocurable, photopatternable, or applicable as a film at a temperature less than about 250° C.

In some embodiments of the first aspect, the organic semiconductor layer comprises a semiconducting small molecule, semiconducting oligomer, or semiconducting polymer. In some embodiments, the organic semiconductor comprises a fused thiophene moiety.

The substrate in the first aspect can comprise a strengthened glass substrate. In some such cases, the a functional layer may be present on the side of the glass substrate opposite the dielectric and OSC layers. Such functional layers may be selected from the group consisting of an anti-glare layer, an anti-smudge layer, a self-cleaning layer, an anti-reflection layer, an anti-fingerprint layer, an optically scattering layer, an anti-splintering layer, and combinations thereof.

In some embodiments, the article comprises a top-gate thin film transistor, photovoltaic device, diode, or display device, such as a top-gate top-contact or top-gate bottom-contact thin film transistor.

A second aspect comprises an article comprising a substrate having a first surface and a second surface; an organic semiconductor layer; a gate, a source, and a drain electrode; a dielectric layer; and an encapsulation layer; wherein the encapsulation layer comprises a polymer:

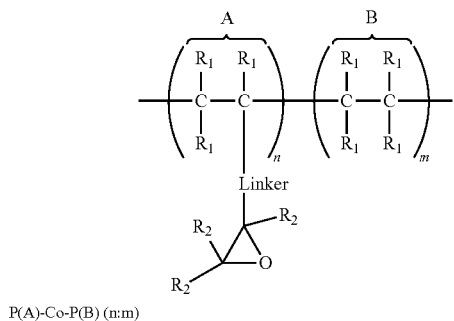

P(A)-Co-P(B) (n:m)

wherein A is an epoxide-containing monomer; B is second monomer; n is an integer of one or greater; m is an integer of one or greater; the ratio of n:m is from about 20:1 to about 1:20; and each $R_1$ and $R_2$ are independently, hydrogen, substituted or unsubstituted alkyl, substituted or unsubstituted aryl or heteroaryl, substituted or unsubstituted cycloalkyl, substituted or unsubstituted aralkyl, ester, alkoxy, thiol, thioalkyl, or halide; and Linker is a substituted or unsubstituted alkyl, substituted or unsubstituted aryl or heteroaryl, substituted or unsubstituted cycloalkyl, aralkyl, ester, ether, alkoxy, alkylthio, or thioalkyl. In some embodiments, the ratio of n:m is about 3:1 to 1:3 and each $R_1$ and $R_2$ are independently, hydrogen, substituted or unsubstituted alkyl, substituted or unsubstituted aryl or heteroaryl. In some embodiments, Linker is a substituted or unsubstituted alkyl or substituted or unsubstituted aryl or heteroaryl. In some embodiments, Linker is a substituted or unsubstituted cycloalkyl, aralkyl, ester, ether, alkoxy, alkylthio, or thioalkyl.

In some embodiments, the dielectric polymer has a dielectric breakdown of greater than 1 MV/cm, or is photocurable, photopatternable, or applicable as a film at a temperature less than about 250° C.

In some embodiments of the first aspect, the organic semiconductor layer comprises a semiconducting small molecule, semiconducting oligomer, or semiconducting polymer. In some embodiments, the organic semiconductor comprises a fused thiophene moiety.

The substrate in the first aspect can comprise a strengthened glass substrate. In some such cases, the a functional layer may be present on the side of the glass substrate opposite the dielectric and OSC layers. Such functional layers may be selected from the group consisting of an anti-glare layer, an anti-smudge layer, a self-cleaning layer, an anti-reflection layer, an anti-fingerprint layer, an optically scattering layer, an anti-splintering layer, and combinations thereof.

In some embodiments, the article comprises a top-gate thin film transistor, photovoltaic device, diode, or display device, such as a top-gate top-contact or top-gate bottom-contact thin film transistor.

A third aspect comprises a method of forming an article, comprising providing a substrate having a first surface and a second surface; providing an organic semiconductor layer; providing a dielectric layer; and providing a gate, a source, and a drain electrode; wherein the dielectric layer comprises:

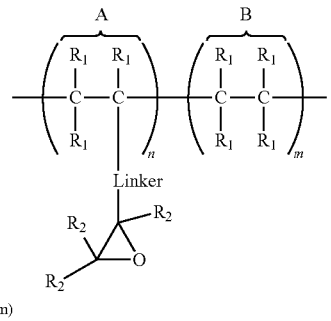

P(A)-Co-P(B) (n:m)

wherein A is an epoxide-containing monomer; B is second monomer; n is an integer of one or greater; m is an integer of one or greater; the ratio of n:m is from about 20:1 to about 1:20; and each $R_1$ and $R_2$ are independently, hydrogen, substituted or unsubstituted alkyl, substituted or unsubstituted aryl or heteroaryl, substituted or unsubstituted cycloalkyl, substituted or unsubstituted aralkyl, ester, alkoxy, thiol, thioalkyl, or halide; and Linker is a substituted or unsubstituted alkyl, substituted or unsubstituted aryl or heteroaryl, substituted or unsubstituted cycloalkyl, aralkyl, ester, ether, alkoxy, alkylthio, or thioalkyl. In some embodiments, the ratio of n:m is about 3:1 to 1:3 and each $R_1$ and $R_2$ are independently, hydrogen, substituted or unsubstituted alkyl, substituted or unsubstituted aryl or heteroaryl. In some embodiments, Linker is a substituted or unsubstituted alkyl or substituted or unsubstituted aryl or heteroaryl. In some embodiments, Linker is a substituted or unsubstituted cycloalkyl, aralkyl, ester, ether, alkoxy, alkylthio, or thioalkyl.

In some embodiments, the dielectric polymer has a dielectric breakdown of greater than 1 MV/cm, or is photocurable, photopatternable, or applicable as a film at a temperature less than about 250° C.

In some embodiments of the first aspect, the organic semiconductor layer comprises a semiconducting small molecule, semiconducting oligomer, or semiconducting polymer. In some embodiments, the organic semiconductor comprises a fused thiophene moiety.

The substrate in the first aspect can comprise a strengthened glass substrate. In some such cases, the a functional layer may be present on the side of the glass substrate opposite the dielectric and OSC layers. Such functional layers may be selected from the group consisting of an anti-glare layer, an anti-smudge layer, a self-cleaning layer, an anti-reflection layer, an anti-fingerprint layer, an optically scattering layer, an anti-splintering layer, and combinations thereof.

In some embodiments, the article comprises a top-gate thin film transistor, photovoltaic device, diode, or display device, such as a top-gate top-contact or top-gate bottom-contact thin film transistor.

In some embodiments, the providing an organic semiconductor layer comprises coating the substrate with the organic semiconductor layer and coating the organic semiconductor layer with the dielectric layer. Alternatively, in some embodiments, the providing a dielectric layer step comprises coating the substrate with the dielectric layer and coating the dielectric layer with the organic semiconductor layer.

In some embodiments, coating comprises sputter coating, atomic layer deposition, ink jet printing, slot-die printing, dip coating, spin coating, Langmuir-Blodgett deposition, electrospray ionization, direct nanoparticle deposition, vapor deposition, chemical deposition, vacuum filtration, flame spray, electrospray, spray deposition, electrodeposition, screen printing, close space sublimation, nano-imprint lithography, in situ growth, microwave assisted chemical vapor deposition, laser ablation, arc discharge, gravure printing, doctor blading, spray-coating, slot die coating, or chemical etching.

A fourth aspect comprises a method of forming an article, comprising providing a substrate having a first surface and a second surface; providing an organic semiconductor layer; providing a dielectric layer; and providing a gate electrode in contact with the strengthened glass substrate and the dielectric layer; and providing a source electrode and a drain electrode; wherein the dielectric layer comprises:

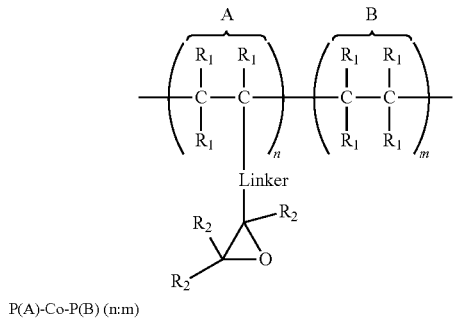

P(A)-Co-P(B) (n:m)

wherein A is an epoxide-containing monomer; B is second monomer; n is an integer of one or greater; m is an integer of one or greater; the ratio of n:m is from about 20:1 to about 1:20; and each $R_1$ and $R_2$ are independently, hydrogen, substituted or unsubstituted alkyl, substituted or unsubstituted aryl or heteroaryl, substituted or unsubstituted cycloalkyl, substituted or unsubstituted aralkyl, ester, alkoxy, thiol, thioalkyl, or halide; and Linker is a substituted or unsubstituted alkyl, substituted or unsubstituted aryl or heteroaryl, substituted or unsubstituted cycloalkyl, aralkyl, ester, ether, alkoxy, alkylthio, or thioalkyl. In some embodiments, the ratio of n:m is about 3:1 to 1:3 and each $R_1$ and $R_2$ are independently, hydrogen, substituted or unsubstituted alkyl, substituted or unsubstituted aryl or heteroaryl. In some embodiments, Linker is a substituted or unsubstituted alkyl or substituted or unsubstituted aryl or heteroaryl. In some embodiments, Linker is a substituted or unsubstituted cycloalkyl, aralkyl, ester, ether, alkoxy, alkylthio, or thioalkyl.

In some embodiments, the dielectric polymer has a dielectric breakdown of greater than 1 MV/cm, or is photocurable, photopatternable, or applicable as a film at a temperature less than about 250° C.

In some embodiments of the first aspect, the organic semiconductor layer comprises a semiconducting small molecule, semiconducting oligomer, or semiconducting polymer. In some embodiments, the organic semiconductor comprises a fused thiophene moiety.

The substrate in the first aspect can comprise a strengthened glass substrate. In some such cases, the a functional layer may be present on the side of the glass substrate opposite the dielectric and OSC layers. Such functional layers may be selected from the group consisting of an anti-glare layer, an anti-smudge layer, a self-cleaning layer, an anti-reflection layer, an anti-fingerprint layer, an optically scattering layer, an anti-splintering layer, and combinations thereof.

In some embodiments, the article comprises a top-gate thin film transistor, photovoltaic device, diode, or display device, such as a top-gate top-contact or top-gate bottom-contact thin film transistor.

In some embodiments, the providing an organic semiconductor layer comprises coating the substrate with the organic semiconductor layer and coating the organic semiconductor layer with the dielectric layer. Alternatively, in some embodiments, the providing a dielectric layer step comprises coating the substrate with the dielectric layer and coating the dielectric layer with the organic semiconductor layer.

In some embodiments, coating comprises sputter coating, atomic layer deposition, ink jet printing, slot-die printing, dip coating, spin coating, Langmuir-Blodgett deposition, electrospray ionization, direct nanoparticle deposition, vapor deposition, chemical deposition, vacuum filtration, flame spray, electrospray, spray deposition, electrodeposition, screen printing, close space sublimation, nano-imprint lithography, in situ growth, microwave assisted chemical vapor deposition, laser ablation, arc discharge, gravure printing, doctor blading, spray-coating, slot die coating, or chemical etching.

DETAILED DESCRIPTION

Figure 1:
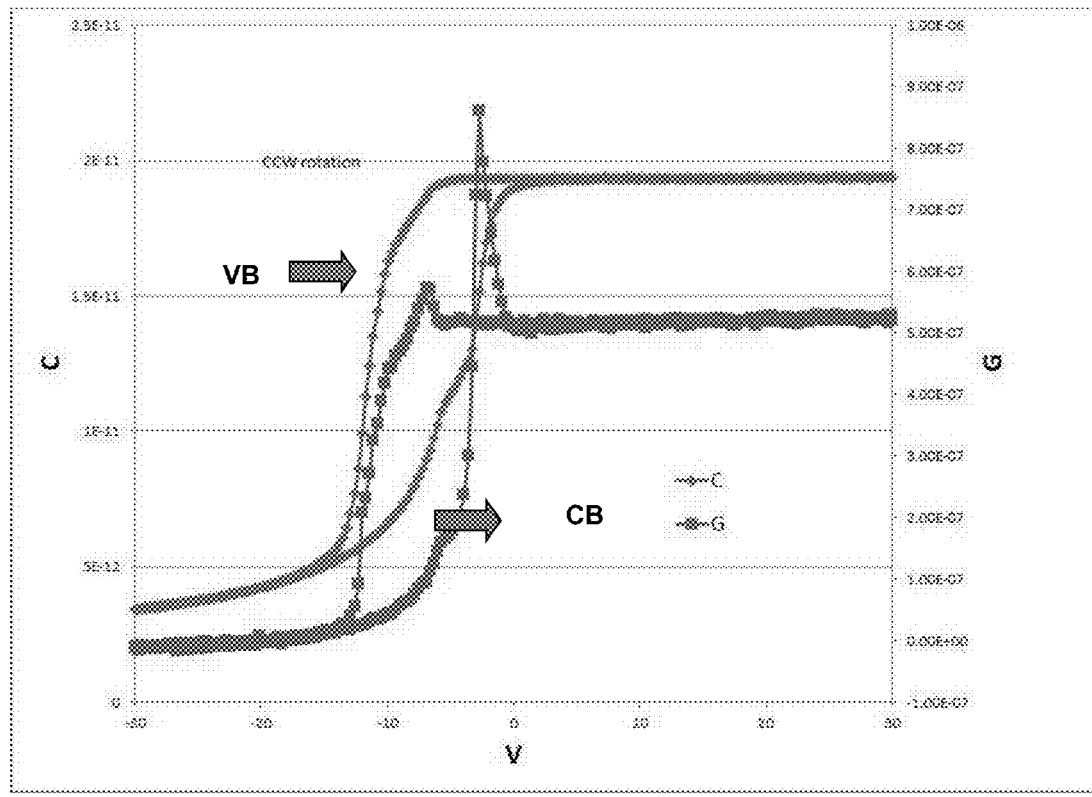
FIG. 1 is a chart showing a CV curve of a MIS structure with a 347 nm thick film of epoxy (Formulation 1) showing ~6 V hysteresis with CCW rotation, and traps near VB and CB edge.

The present embodiments can be understood more readily by reference to the following detailed description, drawings, examples, and claims, and their previous and following description. However, before the present compositions, articles, devices, and methods are disclosed and described, it is to be understood that this description is not limited to the specific compositions, articles, devices, and methods disclosed unless otherwise specified, as such can, of course, vary. It is also to be understood that the terminology used herein is for the purpose of describing particular aspects only and is not intended to be limiting.

The following description is provided as an enabling teaching. To this end, those skilled in the relevant art will recognize and appreciate that many changes can be made to the various embodiments described herein, while still obtaining the beneficial results. It will also be apparent that some of the desired benefits can be obtained by selecting some of the features without utilizing other features. Accordingly, those who work in the art will recognize that many modifications and adaptations to the present embodiments are possible and can even be desirable in certain circumstances and are a part of the present description. Thus, the following description is provided as illustrative and should not be construed as limiting.

The term "alkyl" refers to a monoradical branched or unbranched saturated hydrocarbon chain having 1, 2, 3, 4, 5, 6, 7, 8, 9, 10, 11, 12, 13, 14, 15, 16, 17, 18, 19 20, 30 or 40 carbon atoms, typically 1-20 carbon atoms, more typically from 1 to 10 carbon atoms or 10 to 20 carbon atoms. This term is exemplified by groups such as methyl, ethyl, n-propyl, iso-propyl, n-butyl, iso-butyl, t-butyl, n-hexyl, n-decyl, tetradecyl, and the like.

The term "substituted alkyl" refers to: (1) an alkyl group as defined above, having 1, 2, 3, 4 or 5 substituents, typically 1 to 3 substituents, selected from the group consisting of alkenyl, alkynyl, alkoxy, cycloalkyl, cycloalkenyl, acyl, acylamino, acyloxy, amino, aminocarbonyl, alkoxycarbonylamino, azido, cyano, halogen, ester, ether, aralkyl, thioalkyl, hydroxy, keto, thiocarbonyl, carboxy, carboxyalkyl, arylthio, heteroarylthio, heterocyclylthio, thiol, alkylthio, aryl, aryloxy, heteroaryl, amino sulfonyl, aminocarbonyl amino, heteroaryloxy, heterocyclyl, heterocyclooxy, hydroxyamino, alkoxyamino, nitro, —SO-alkyl, —SO-aryl, —SO— heteroaryl, —SO$_2$-alkyl, SO$_2$-aryl and —SO$_2$-heteroaryl. Unless otherwise constrained by the definition, all substituents may optionally be further substituted by 1, 2, or 3 substituents chosen from alkyl, carboxy, carboxyalkyl, aminocarbonyl, hydroxy, alkoxy, halogen, CF$_3$, amino, substituted amino, cyano, and —S(O)$_p$R$_{SO}$, where R$_{SO}$ is alkyl, aryl, or heteroaryl and p is 0, 1 or 2; or (2) an alkyl group as defined above that is interrupted by 1-10 atoms independently chosen from oxygen, sulfur and NR$_a$, where R$_a$ is chosen from hydrogen, alkyl, cycloalkyl, alkenyl, cycloalkenyl, alkynyl, aryl, heteroaryl and heterocyclyl. All substituents may be optionally further substituted by alkyl, alkoxy, halogen, CF$_3$, amino, substituted amino, cyano, or —S(O)$_p$R$_{SO}$, in which R$_{SO}$ is alkyl, aryl, or heteroaryl and p is 0, 1 or 2; or (3) an alkyl group as defined above that has both 1, 2, 3, 4 or 5 substituents as defined above and is also interrupted by 1-10 atoms as defined above.

The term "alkoxy" refers to the group D-O—, where D is an optionally substituted alkyl or optionally substituted cycloalkyl, or D is a group —Y—W, in which Y is optionally substituted alkylene and W is optionally substituted alkenyl, optionally substituted alkynyl; or optionally substituted cycloalkenyl, where alkyl, alkenyl, alkynyl, cycloalkyl and cycloalkenyl are as defined herein. Typical alkoxy groups are optionally substituted alkyl-O— and include, by way of example, methoxy, ethoxy, n-propoxy, iso-propoxy, n-butoxy, tert-butoxy, sec-butoxy, n-pentoxy, n-hexoxy, 1,2-dimethylbutoxy, trifluoromethoxy, and the like.

The term "alkylene" refers to a diradical of a branched or unbranched saturated hydrocarbon chain, having 1, 2, 3, 4, 5, 6, 7, 8, 9, 10, 11, 12, 13, 14, 15, 16, 17, 18, 19 or 20 carbon atoms, typically 1-10 carbon atoms, more typically 1, 2, 3, 4, 5 or 6 carbon atoms. This term is exemplified by groups such as methylene (—CH$_2$—), ethylene (—CH$_2$CH$_2$—), the propylene isomers (e.g., —CH$_2$CH$_2$CH$_2$— and —CH(CH$_3$)CH$_2$—) and the like.

The term "alkylthio" refers to the group R$_S$—S—, where R$_S$ is as D is defined for alkoxy.

The term "alkenyl" refers to a monoradical of a branched or unbranched unsaturated hydrocarbon group typically having from 2 to 20 carbon atoms, more typically 2 to 10 carbon atoms and even more typically 2 to 6 carbon atoms and having 1-6, typically 1, double bond (vinyl). Typical alkenyl groups include ethenyl or vinyl (—CH=CH$_2$), 1-propylene or allyl (—CH$_2$CH=CH$_2$), isopropylene (—C(CH$_3$)=CH$_2$), bicyclo[2.2.1]heptene, and the like. In the event that alkenyl is attached to nitrogen, the double bond cannot be alpha to the nitrogen.

The term "alkynyl" refers to a monoradical of an unsaturated hydrocarbon, typically having from 2 to 20 carbon atoms, more typically 2 to 10 carbon atoms and even more typically 2 to 6 carbon atoms and having at least 1 and typically from 1-6 sites of acetylene (triple bond) unsaturation. Typical alkynyl groups include ethynyl, (—C≡CH), propargyl (or prop-1-yn-3-yl, —CH$_2$C≡CH), and the like. In the event that alkynyl is attached to nitrogen, the triple bond cannot be alpha to the nitrogen.

The term "aminocarbonyl" refers to the group —C(O)NR$_N$R$_N$ where each R$_N$ is independently hydrogen, alkyl, aryl, heteroaryl, heterocyclyl or where both R$_N$ groups are joined to form a heterocyclic group (e.g., morpholino). Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and —S(O)$_p$R$_{SO}$, where R$_{SO}$ is alkyl, aryl, or heteroaryl and p is 0, 1 or 2.

The term "acylamino" refers to the group —NR$_{NCO}$C(O)R$_a$ where each R$_{NCO}$ is independently hydrogen, alkyl, aryl, heteroaryl, or heterocyclyl and R$_a$ is chosen from hydrogen, alkyl, cycloalkyl, alkenyl, cycloalkenyl, alkynyl, aryl, heteroaryl and heterocyclyl. Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and —S(O)$_p$R$_{SO}$, where R$_{SO}$ is alkyl, aryl, or heteroaryl and p is 0, 1 or 2.

The term "acyloxy" refers to the groups —O(O)C-alkyl, —O(O)C-cycloalkyl, —O(O)C-aryl, —O(O)C-heteroaryl, and —O(O)C-heterocyclyl. Unless otherwise constrained by the definition, all substituents may be optionally further substituted by alkyl, carboxy, carboxyalkyl, aminocarbonyl, hydroxy, alkoxy, halogen, CF$_3$, amino, substituted amino, cyano, and —S(O)$_p$R$_{SO}$, where R$_{SO}$ is alkyl, aryl, or heteroaryl and p is 0, 1 or 2.

The term "aryl" refers to an aromatic carbocyclic group of 6 to 20 carbon atoms having a single ring (e.g., phenyl) or multiple rings (e.g., biphenyl), or multiple condensed (fused) rings (e.g., naphthyl or anthryl). Typical aryls include phenyl, naphthyl and the like.

Unless otherwise constrained by the definition for the aryl substituent, such aryl groups can optionally be substituted with from 1 to 5 substituents, typically 1 to 3 substituents, selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, ester, ether, aralkyl, thioalkyl, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$-alkyl, SO$_2$-aryl and —SO$_2$-heteroaryl. Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and —S(O)$_p$R$_{SO}$, where R$_{SO}$ is alkyl, aryl, or heteroaryl and p is 0, 1 or 2.

The term "aryloxy" refers to the group aryl-O— wherein the aryl group is as defined above, and includes optionally substituted aryl groups as also defined above. The term "arylthio" refers to the group aryl-S—, where aryl is as defined as above.

The term "amino" refers to the group —NH$_2$.

The term "substituted amino" refers to the group —NR$_w$R$_w$ where each R$_w$ is independently selected from the group consisting of hydrogen, alkyl, cycloalkyl, carboxyalkyl (for example, benzyloxycarbonyl), aryl, heteroaryl and heterocyclyl provided that both R$_w$ groups are not hydrogen, or a group —Y—Z, in which Y is optionally substituted alkylene and Z is alkenyl, cycloalkenyl, or alkynyl. Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and —S(O)$_p$R$_{SO}$, where R$_{SO}$ is alkyl, aryl, or heteroaryl and p is 0, 1 or 2.

The term "carboxyalkyl" refers to the groups —C(O)O-alkyl or —C(O)O-cycloalkyl, where alkyl and cycloalkyl, are as defined herein, and may be optionally further substituted by alkyl, alkenyl, alkynyl, alkoxy, halogen, CF$_3$, amino, substituted amino, cyano, and —S(O)$_p$R$_{SO}$, in which R$_{SO}$ is alkyl, aryl, or heteroaryl and p is 0, 1 or 2.

The term "cycloalkyl" refers to carbocyclic groups of from 3 to 20 carbon atoms having a single cyclic ring or multiple condensed rings. Such cycloalkyl groups include, by way of example, single ring structures such as cyclopropyl, cyclobutyl, cyclopentyl, cyclooctyl, and the like, or multiple ring structures such as adamantanyl, bicyclo[2.2.1]heptane, 1,3,3-trimethylbicyclo[2.2.1]hept-2-yl, (2,3,3-trimethylbicyclo[2.2.1]hept-2-yl), or carbocyclic groups to which is fused an aryl group, for example indane, and the like.

The term "cycloalkenyl" refers to carbocyclic groups of from 3 to 20 carbon atoms having a single cyclic ring or multiple condensed rings with at least one double bond in the ring structure.

The terms "substituted cycloalkyl" or "substituted cycloalkenyl" refer to cycloalkyl or cycloalkenyl groups having 1, 2, 3, 4 or 5 substituents, and typically 1, 2, or 3 substituents, selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, ester, ether, aralkyl, thioalkyl, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$-alkyl, SO$_2$-aryl and —SO$_2$-heteroaryl. Unless otherwise constrained by the definition, all substituents may optionally be further substituted by 1, 2, or 3 substituents chosen from alkyl, carboxy, carboxyalkyl, aminocarbonyl, hydroxy, alkoxy, halogen, CF$_3$, amino, substituted amino, cyano, and —S(O)$_p$R$_{SO}$, where R$_{SO}$ is alkyl, aryl, or heteroaryl and p is 0, 1 or 2.

The term "halogen," "halide," or "halo" refers to fluoro, bromo, chloro, and iodo.

The term "acyl" denotes a group —C(O)R$_{CO}$, in which R$_{CO}$ is hydrogen, optionally substituted alkyl, optionally substituted cycloalkyl, optionally substituted heterocyclyl, optionally substituted aryl, and optionally substituted heteroaryl.

The term "heteroaryl" refers to a radical derived from an aromatic cyclic group (i.e., fully unsaturated) having 1, 2, 3, 4, 5, 6, 7, 8, 9, 10, 11, 12, 13, 14, or 15 carbon atoms and 1, 2, 3 or 4 heteroatoms selected from oxygen, nitrogen and sulfur within at least one ring. Such heteroaryl groups can have a single ring (e.g., pyridyl or furyl) or multiple condensed rings (e.g., indolizinyl, benzothiazolyl, or benzothienyl). Examples of heteroaryls include, but are not limited to, [1,2,4]oxadiazole, [1,3,4]oxadiazole, [1,2,4]thiadiazole, [1,3,4]thiadiazole, pyrrole, imidazole, pyrazole, pyridine, pyrazine, pyrimidine, pyridazine, indolizine, isoindole, indole, indazole, purine, quinolizine, isoquinoline, quinoline, phthalazine, naphthylpyridine, quinoxaline, quinazoline, cinnoline, pteridine, carbazole, carboline, phenanthridine, acridine, phenanthroline, isothiazole, phenazine, isoxazole, phenoxazine, phenothiazine, imidazolidine, imidazoline, triazole, oxazole, thiazole, naphthyridine, and the like as well as N-oxide and N-alkoxy derivatives of nitrogen containing heteroaryl compounds, for example pyridine-N-oxide derivatives.

Unless otherwise constrained by the definition for the heteroaryl substituent, such heteroaryl groups can be optionally substituted with 1 to 5 substituents, typically 1 to 3 substituents selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, ester, ether, aralkyl, thioalkyl, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO— alkyl, —SO-aryl, —SO-heteroaryl, —SO$_2$-alkyl, SO$_2$-aryl and —SO$_2$-heteroaryl. Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and —S(O)$_p$R$_{SO}$, where R$_{SO}$ is alkyl, aryl, or heteroaryl and p is 0, 1 or 2.

The term "heteroaryloxy" refers to the group heteroaryl-O—.

The term "heterocyclyl" refers to a monoradical saturated or partially unsaturated group having a single ring or multiple condensed rings, having from 1 to 40 carbon atoms and from 1 to 10 hetero atoms, typically 1, 2, 3 or 4 heteroatoms, selected from nitrogen, sulfur, phosphorus, and/or oxygen within the ring. Heterocyclic groups can have a single ring or multiple condensed rings, and include tetrahydrofuranyl, morpholino, piperidinyl, piperazino, dihydropyridino, and the like.

The term "thiol" refers to the group —SH.

The term "substituted alkylthio" refers to the group —S— substituted alkyl.

The term "heteroarylthio" refers to the group —S—heteroaryl wherein the heteroaryl group is as defined above including optionally substituted heteroaryl groups as also defined above.

The term "sulfoxide" refers to a group —S(O)R$_{SO}$, in which R$_{SO}$ is alkyl, aryl, or heteroaryl. "Substituted sulfoxide" refers to a group —S(O)R$_{SO}$, in which R$_{SO}$ is substituted alkyl, substituted aryl, or substituted heteroaryl, as defined herein.

The term "sulfone" refers to a group —S(O)$_2$R$_{SO}$, in which R$_{SO}$ is alkyl, aryl, or heteroaryl. "Substituted sulfone" refers to a group —S(O)$_2$R$_{SO}$, in which R$_{SO}$ is substituted alkyl, substituted aryl, or substituted heteroaryl, as defined herein.

The term "keto" refers to a group —C(O)—R$_a$, where R$_a$ is chosen from hydrogen, or alkyl, cycloalkyl, alkenyl, cycloalkenyl, alkynyl, aryl, heteroaryl and heterocyclyl, all of which may be optionally substituted with 1-3 substituents chosen from alkyl, carboxy, carboxyalkyl, aminocarbonyl, hydroxy, alkoxy, halogen, $CF_3$, amino, substituted amino, cyano.

The term "thiocarbonyl" refers to a group —C(S)—$R_a$, where $R_a$ is chosen from hydrogen, or alkyl, cycloalkyl, alkenyl, cycloalkenyl, alkynyl, aryl, heteroaryl and heterocyclyl, all of which may be optionally substituted with 1-3 substituents chosen from alkyl, carboxy, carboxyalkyl, aminocarbonyl, hydroxy, alkoxy, halogen, $CF_3$, amino, substituted amino, and cyano.

The term "carboxy" refers to a group —C(O)OH.

The term "ester" refers to a group —OC(O)$R_e$ or —C(O)O$R_e$, where $R_e$ is chosen from alkyl, cycloalkyl, alkenyl, cycloalkenyl, alkynyl, aryl, heteroaryl and heterocyclyl, all of which may be optionally substituted with 1-3 substituents chosen from alkyl, carboxy, carboxyalkyl, aminocarbonyl, hydroxy, alkoxy, halogen, $CF_3$, amino, substituted amino, and cyano.

The term "ether" refers to a group -alkyl-O-alkyl, where each alkyl is independently an optionally substituted alkyl group as defined herein.

The term "thioalkyl" refers to a group -alkyl-S—$R_{TA}$ where alkyl is an optionally substituted alkyl group and $R_{TA}$ is chosen from hydrogen (in some embodiments, e.g., where the Linker group is thioalkyl, $R_{TA}$ cannot be hydrogen), alkyl, cycloalkyl, alkenyl, cycloalkenyl, alkynyl, aryl, heteroaryl and heterocyclyl, all of which may be optionally substituted with 1-3 substituents chosen from alkyl, carboxy, carboxyalkyl, aminocarbonyl, hydroxy, alkoxy, halogen, $CF_3$, amino, substituted amino, and cyano.

The term "aralkyl" refers to a group -alkyl-aryl-$R_{AR}$ where alkyl is an optionally substituted alkyl group, aryl is an optionally substituted aryl or heteroaryl group, and $R_{AR}$ is chosen from hydrogen (in some embodiments, e.g., where the Linker group is thioalkyl, $R_{TA}$ cannot be hydrogen), alkyl, cycloalkyl, alkenyl, cycloalkenyl, alkynyl, aryl, heteroaryl and heterocyclyl, all of which may be optionally substituted with 1-3 substituents chosen from alkyl, carboxy, carboxyalkyl, aminocarbonyl, hydroxy, alkoxy, halogen, $CF_3$, amino, substituted amino, and cyano.

Disclosed are materials, compounds, compositions, and components that can be used for, can be used in conjunction with, can be used in preparation for, or are embodiments of the disclosed method and compositions. These and other materials are disclosed herein, and it is understood that when combinations, subsets, interactions, groups, etc. of these materials are disclosed that while specific reference of each various individual and collective combinations and permutation of these compounds may not be explicitly disclosed, each is specifically contemplated and described herein. Thus, if a class of substituents A, B, and C are disclosed as well as a class of substituents D, E, and F, and an example of a combination embodiment, A-D is disclosed, then each is individually and collectively contemplated. Thus, in this example, each of the combinations A-E, A-F, B-D, B-E, B-F, C-D, C-E, and C—F are specifically contemplated and should be considered disclosed from disclosure of A, B, and C; D, E, and F; and the example combination A-D. Likewise, any subset or combination of these is also specifically contemplated and disclosed. Thus, for example, the subgroup of A-E, B-F, and C-E are specifically contemplated and should be considered disclosed from disclosure of A, B, and C; D, E, and F; and the example combination A-D. This concept applies to all aspects of this disclosure including, but not limited to any components of the compositions and steps in methods of making and using the disclosed compositions. Thus, if there are a variety of additional steps that can be performed it is understood that each of these additional steps can be performed with any specific embodiment or combination of embodiments of the disclosed methods, and that each such combination is specifically contemplated and should be considered disclosed.

In this specification and in the claims which follow, reference will be made to a number of terms which shall be defined to have the meanings detailed herein.

"Include," "includes," or like terms means encompassing but not limited to, that is, inclusive and not exclusive.

The term "about" references all terms in the range unless otherwise stated. For example, about 1, 2, or 3 is equivalent to about 1, about 2, or about 3, and further comprises from about 1-3, from about 1-2, and from about 2-3. Specific and preferred values disclosed for compositions, components, ingredients, additives, and like aspects, and ranges thereof, are for illustration only; they do not exclude other defined values or other values within defined ranges. The compositions and methods of the disclosure include those having any value or any combination of the values, specific values, more specific values, and preferred values described herein.

The indefinite article "a" or "an" and its corresponding definite article "the" as used herein means at least one, or one or more, unless specified otherwise As used herein, the term "adjacent" can be defined as being in close proximity. Adjacent structures may or may not be in physical contact with each other. Unless specifically disclaimed, adjacent structures can have other layers and/or structures disposed between them.

All references described or disclosed herein are incorporated by reference in their entireties.

Dielectrics

A major challenge for polymer transistors is to fabricate an ultrathin defect-free gate dielectric layer that also has a high-quality interface with the adjacent semiconductive layer. This dielectric layer has to show high dielectric breakdown strength, very low electrical conductivity, very low interface and bulk trapping of carriers, as well as be molecularly smooth and also be chemically stable and insoluble to the typical conventional semiconductor processing solvents. Additionally, a good capacitance-voltage characteristic is necessary to minimize the leakage current of the gate dielectric to achieve an efficient formation of an ideal field-effect channel within the organic semiconductor layer.

In order to provide stability when exposed to various solvents during device fabrication, a polymeric dielectric material would ideally be crosslinked. In such cases, the crosslinking reaction should take place rapidly to facilitate manufacturing processes, and the ability to pattern such a crosslinked material would also be highly desirable. Even assuming the above criteria are met, an additional requirement is that the gate dielectric materials are UV-curable, allowing them to be photo-cured and/or photo-patterned—a necessity to realize printability and flexibility in low-cost OFET technologies.

As noted above, although there many insulating polymer systems known, one that can fulfill all of the above requirements and be compatible with the other organic materials in an electronic device is not trivial. Examples of systems that have been tried include:

Polyimide system (115 J. AMER. CHEM. SOC. 8716-21 (1993)) is based on thermal conversion of a precursor acid to the insoluble polyimide and is often deposited before the semiconductive polymer to give a bottom-gate configured device. However, the conversion requires prolonged curing at high temperatures above 200° C. with the release of water vapor and large volume shrinkage. The composition described is not radiation curable or capable of being easily patterned.

PMMA system (8 ADV. MATER. 52-54 (1996)) is based on the solubility of PMMA in ester solvents (such as alkyl acetates) which do not swell or roughen the interface of the semiconductive polymer layer, which is often deposited from aromatic hydrocarbon solvents. Therefore, PMMA can be deposited subsequent to the formation of the semiconductive polymer layer to give top-gate configured devices. But, PMMA is not a crosslinked polymer and this composition is not radiation curable or patternable.

PVP systems (290 SCIENCE 2123-26 (2000), 93 J. APPL. PHYS. 2977-81 (2003)) are based on the solubility of PVP in alcohol and other polar solvents which again do not swell or roughen the interface of the semiconductive polymer layer. PVP however possesses acidic phenolic groups that are hygroscopic and may degrade channel properties. The material is also not radiation curable. This leads to insufficient film-forming properties of the polymer Photoresist systems (77 APPL. PHYS. LETT. 1487-89 (2000), 21 Opt. Mater. 425-28 (2003)) are usually based on negative resist technology, for example, via photogenerated acid crosslinking of epoxy or oxetane groups. The crosslinked material is insolubilized and may be used in bottom- or top-gate configurations Unfortunately, all these candidate systems can suffer from poor dielectric breakdown strength, often considerably less than 1 MV/cm. Further, they cannot be readily deposited to give ultrathin films that are conformal and pinhole-free. Still further, with all of these candidate systems it remains to be seen if the semiconductive polymer/dielectric interface has sufficient chemical and thermal stability for commercial applications In addition to gate insulator, there exists a need for a polymer passivation or encapsulation layer with the same properties of low conductivity, high dielectric breakdown strength, high thermal stability and low fixed charge. Typically this layer is deposited over the active layer of a bottom gate transistor to prevent chemical and physical sorption of charged or dipole species on the back of the device channel. These charged and dipole species can shift threshold voltage or introduce trap states which can alter or degrade electrical performance. As with gate dielectrics, it is preferred that these passivation or encapsulation materials be formable into thin conformal and pinhole-free films which create a high-quality interface with the back channel of the semiconductor layer.

In view of the above, there still remains a need to obtain new polymer dielectric systems for use in transistors. Preferably, the new polymer dielectric systems should be easy to fabricate in a desired pattern on a variety of substrates and exhibit high flexure strength and environmental resistance. Also, they should have low bulk electrical conductivity, high dielectric breakdown strength, high thermal stability, and low fixed charge. Additionally, it is highly advantageous for the polymers to be formable into a thin, conformal, pinhole-free film that can present a high-quality interface with a polymeric, semiconductive layer.

A first aspect comprises photo-curable, epoxide containing polymers for use in OTFT applications. Embodied photo-curable epoxide polymers may be described generally by the structure:

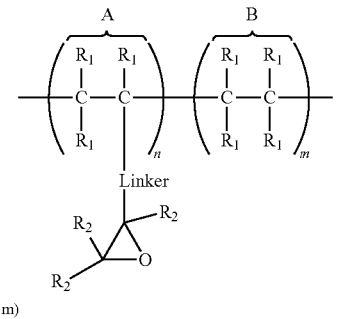

P(A)-Co-P(B) (n:m)

wherein A is an epoxide-containing monomer; B is second monomer; n is an integer of one or greater; m is an integer of one or greater; the ratio of n:m is from about 20:1 to about 1:20; and each $R_1$ and $R_2$ are independently, hydrogen, substituted or unsubstituted alkyl, substituted or unsubstituted aryl or heteroaryl, substituted or unsubstituted cycloalkyl, substituted or unsubstituted aralkyl, ester, alkoxy, thiol, thioalkyl, or halide; and Linker is a substituted or unsubstituted alkyl, substituted or unsubstituted aryl or heteroaryl, substituted or unsubstituted cycloalkyl, aralkyl, ester, ether, alkoxy, alkylthio, or thioalkyl.

Specific embodiments of the photo-curable, epoxide containing polymers contemplated herein include:

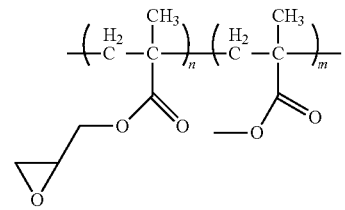

PGMA-Co-PMMA (n:m)

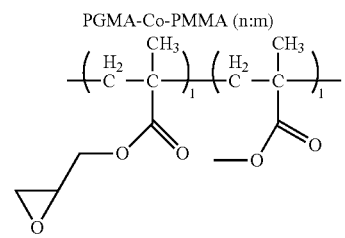

PGMA-Co-PMMA (1:1)

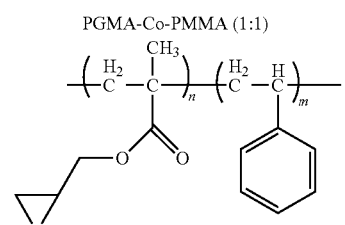

PGMA-Co-GPPS (n:m)

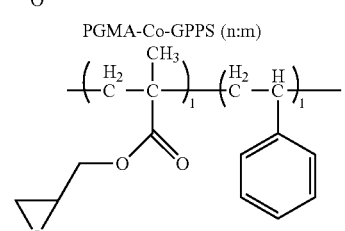

PGMA-Co-GPPS (1:1)

where n is an integer of one or greater; m is an integer of one or greater; the ratio of n:m is from about 20:1 to about 1:20.

Generally, polymers described herein may be synthesized via reactions such as:

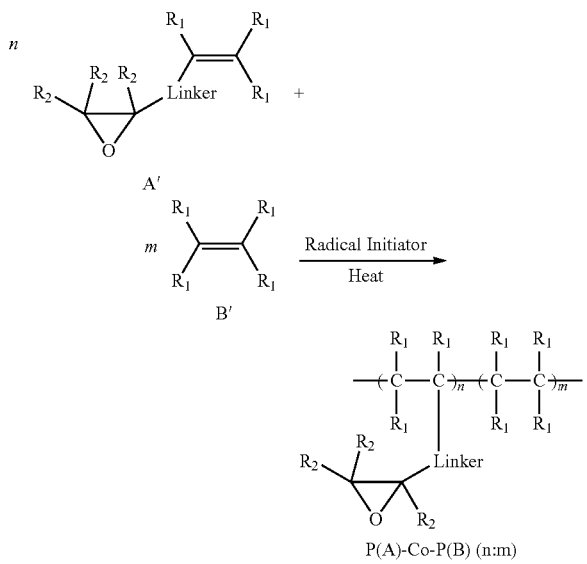

wherein A' is an epoxide-containing monomer; B' is second monomer; n is an integer of one or greater; m is an integer of one or greater; the ratio of n:m is from about 20:1 to about 1:20; and each $R_1$ and $R_2$ are independently, hydrogen, substituted or unsubstituted alkyl, substituted or unsubstituted aryl or heteroaryl, substituted or unsubstituted cycloalkyl, substituted or unsubstituted aralkyl, ester, alkoxy, thiol, thioalkyl, or halide; and Linker is a substituted or unsubstituted alkyl, substituted or unsubstituted aryl or heteroaryl, substituted or unsubstituted cycloalkyl, aralkyl, ester, ether, alkoxy, alkylthio, or thioalkyl. Radical initiators include, but are not limited to, AIBN, ACHN, AAPH, etc. Reactions may be done under reflux conditions and reaction temperatures may be from about 25° C. to 150° C., and are mainly a function of solvent and polymerization conditions.

For example, one embodiment of a photo-curable epoxide polymer for use in gate dielectric applications is poly(glycidylmethacrylate)-co-poly(methylmethacrylate), or PGMA-Co-PMMA (n:m):

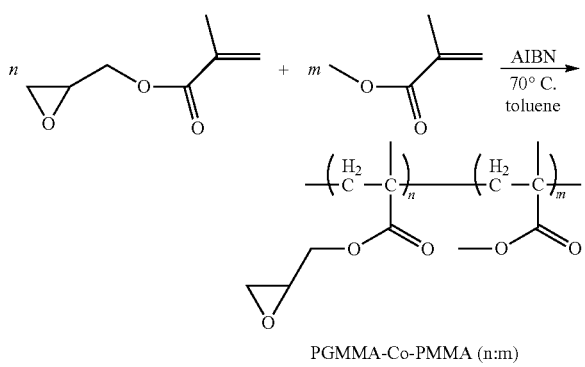

PGMMA-Co-PMMA (n:m)

Polymers that meet the above criteria are also potentially useful as polymer passivation or encapsulation layers. The polymers described here have the following properties making them ideal as dielectric or encapsulation layers for organic semiconductor based devices: 1) they can be rapidly photo-patterned with no or minimal thermal treatment using equipment common to semi-conductor fabrication facilities (i-line, 365 nm) to form uniform, pinhole-free surfaces; 2) when cured, they are resistant to solvents and temperatures commonly encountered in fabrication of OSC devices with various configurations; 3) they have good dielectric breakdown strength and also have low residual bulk electrical conductivity and fixed charge; and 4) they have excellent electrically insulating properties, which can enable their use as dielectrics.

The processing characteristics of the disclosed compositions are capable of curing in a shorter time than typical compositions, using energy density <500 $mJ/cm^2$ (UV A, EIT) applied by a 1000 W ozone free Xenon lamp delivering 18 $mW/cm^2$ intensity (UV A, EIT).

Several advantages of synthesizing these photo-curable epoxide-containing organic polymeric materials functional groups: (a) The molecular weight of these copolymers can be controlled by varying chain transfer reagents, radical initiators, reaction time, and temperature; (b) Different monomers in the copolymer synthesis can be used to see their effect to dielectric properties; (c) Different ratios of two monomers can be used to adjust the dielectric properties; (d) By controlling the identity and ratio of monomers, surface characteristics can be adjusted to optimize interfacial interaction with the OSC material in bottom gate OFET devices. This can result in enhanced OSC alignment and better device performance.

Among other desirable properties, the polymers or monomers of the present teachings can be soluble in common organic solvents but can become insoluble in the same solvents after undergoing crosslinking, for example, photo-crosslinking, which gives rise to certain processing advantages. The crosslinking functionality can allow formation of a densely crosslinked polymeric matrix. Their formulation is photo-curable and photo-patternable.

Figure 5:
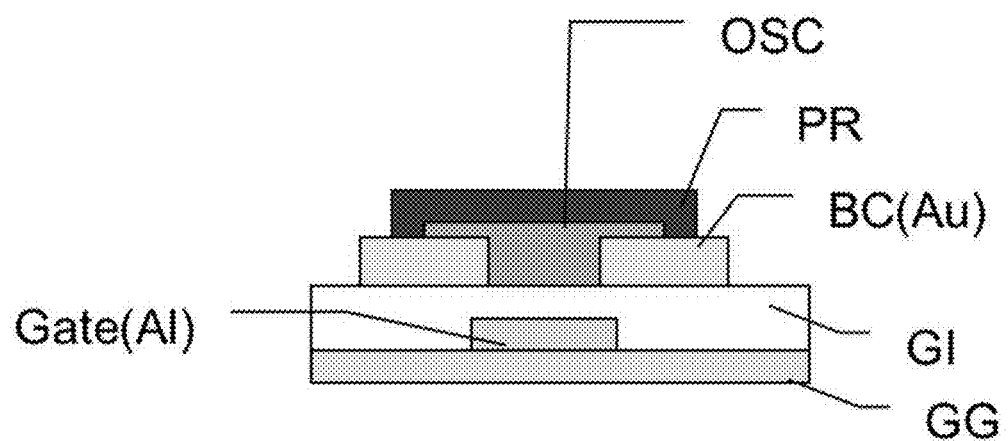
FIG. 5 is an example of a of bottom gate-bottom contact OTFT on PEN using an Al gate, a photocured epoxide gate insulator (e.g., Sample H), an Ag source/drain, an organic semiconductor (e.g., PTDC16DPPTDC17FT4), and a photo-patterned epoxide passivation used to mask a channel for dry etching.

Another aspect described herein is articles comprising the dielectric polymers embodied herein. More specifically, articles comprising the dielectric polymers embodied herein may comprise organic thin film transistors. OTFTs can be of any structure, including "bottom-gate top-contact transistor," "bottom-gate bottom-contact transistor," "top-gate top-contact transistor," and "top-gate top-contact transistor" as shown in U.S. Pat. No. 8,901,544, herein incorporated by reference in its entirety. An organic TFT device can include: a glass substrate including the adjacent barrier layer (FIG. 5, "GG"). On the barrier layer, a gate electrode (FIG. 5, "Gate (Al)"), a dielectric layer (FIG. 5, "GI"), a drain electrode (FIG. 5, one of "BC (AU)"), a source electrode ((FIG. 5, other of "BC (AU)"), an optional passivation layer (FIG. 5, "PR") and an organic semiconducting channel layer can be adjacently formed (FIG. 5, "OSC"). These layers can be stacked in different sequences to form a laterally or vertically configured transistor device with optional layers in between. The organic semiconducting channel layer includes semiconducting small molecules, oligomers and/or polymers.

In some embodiments, the organic semiconductor layer comprises semiconducting small molecules, oligomers and/or polymers. Semiconducting small molecules include the polycyclic aromatic compounds, such as pentacene, anthracene, and rubrene and other conjugated aromatic hydrocarbons. Polymeric organic semiconductors include, for example, poly(3-hexylthiophene), poly(p-phenylene vinylene), as well as polyacetylene and its derivatives. Generally speaking, there are two major overlapping classes of organic semiconductors—organic charge-transfer complexes and various linear-backbone conductive polymers derived from polyacetylene and similar compounds, such as polypyrrole, and polyaniline. However, embodiments are not limited in scope to only these types of organic semiconductors, and, as shown in the examples, are capable of working with a broad range of organic semiconductors.

In some embodiments, the organic semiconductor layer comprises a fused thiophene compound. In some embodiments, the fused thiophene is incorporated into a polymer. Fused thiophenes and fused thiophene polymers may comprise compounds as described in U.S. Pat. Nos. 7,705,108, 7,838,623, 7,893,191, 7,919,634, 8,217,183, 8,278,346, U.S. application Ser. Nos. 12/905,667, 12/907,453, 12/935,426, 13/093,279, 13/036,269, 13/660,637, 13/660,529, and U.S. Prov. Appl. Nos. 61/617,202, and 61/693,448, all herein incorporated by reference in their entireties.

Particular examples of fused thiophene compounds that may be used include, but are not limited to, poly[(3,7-diheptadecylthieno[3,2-b]thieno[2',3':4,5]thieno[2,3-d]thiophene-2,6-diyl)(2,2'-bithiophene)-5,5'-diyl](P2TDC17FT4), poly[(3,7-diheptadecylthieno[3,2-b]thieno[2',3':4,5]thieno[2,3-d]thiophene-2,6-diyl)(2,5-dihexadecyl-3,6-di(thiophen-2-yl)pyrrolo[3,4-c]pyrrole-1,4(2H,5H)-dione)-5,5'-diyl], poly-3, 6-dihexyl-thieno[3,2-b]thiophene (PDC6FT2), poly-3, 6-didecanyl-thieno[3,2-b]thiophene (PDC10FT2), poly[(3,7-diheptadecylthieno[3,2-b]thieno[2',3':4,5]thieno[2,3-d]thiophene-2,6-diyl)(1-hexadecyl-3-(1-hexadecyl-2-oxoindol-3-ylidene)indol-2-one-6,6'-diyl)], and poly[(3,7-diheptadecylthieno[3.2-b]thieno[2',3':4,5]thieno[2,3-d]thiophene-2,6-diyl)(stilbene-1,4'-diyl)], Poly[(3,7-diheptadecylthieno[3,2-b]thieno[2',3':   4,5]thieno[2,3-d]thiophene-2,6-diyl)(2,5-dihexadecyl-3, 6-di(thiophen-2-yl)pyrrolo   [3,4-c]pyrrole-1,4(2H,5H)-dione)-5,5'-diyl] (PTDC16DPPTDC17FT4).

In some embodiments, the organic semiconductor layer may comprise one or more electroluminescent organic compounds. In some embodiments, the semiconducting small molecules, oligomers and/or polymers of the semiconductor layer may comprise electroluminescent organic compounds.

In some embodiments, the organic semiconductor layer is formed by such processes as dip coating, spin coating, Langmuir-Blodgett deposition, electrospray ionization, direct nanoparticle deposition, vapor deposition, chemical deposition, spray deposition, screen printing, nano-imprint lithography, gravure printing, doctor blading, spray-coating, slot die coating, ink jet printing, laser deposition, drop casting or chemical etching.

Substrates that can be used in embodiments described herein can comprise any material that meets the necessary device limitations known to those of skill in the art. Examples include polymers, papers, and glasses. In some embodiments, the substrate used is a strengthened glass substrate, such as an alkali-containing glass. In some embodiments, the strengthened glass substrate comprises an aluminoborosilicate, an alkalialuminoborosilicate, an aluminosilicate, an alkalialuminosilicate, or a soda lime glass. In some embodiments, the glass comprises an ion exchanged glass as described in U.S. Prov. Appl. Nos. 61/560,434, 61/653,489, and 61/653,485, and U.S. application Ser. Nos. 12/858,490, 12/277,573, 13/588,581, 11/888,213, 13/403,756, 12/392,577, 13/346,235, 13/495,355, 12/858,490, 13/533,298, 13/291,533, and 13/305,271, all of which are hereby incorporated by reference in their entirety.

The dielectric layer may act as a gate insulator (FIG. 5, "GI") or encapsulation layer in an electronic device. The gate insulator (or encapsulation layer) can comprise a photocurable, epoxide containing polymers described generally by the structure:

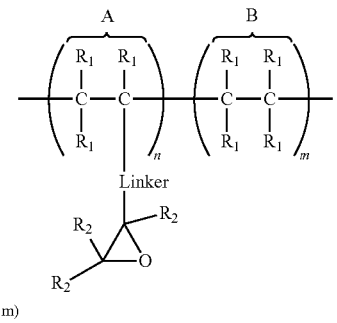

P(A)-Co-P(B) (n:m)

wherein A is an epoxide-containing monomer; B is second monomer; n is an integer of one or greater; m is an integer of one or greater; the ratio of n:m is from about 20:1 to about 1:20; and each $R_1$ and $R_2$ are independently, hydrogen, substituted or unsubstituted alkyl, substituted or unsubstituted aryl or heteroaryl, substituted or unsubstituted cycloalkyl, substituted or unsubstituted aralkyl, ester, alkoxy, thiol, thioalkyl, or halide; and Linker is a substituted or unsubstituted alkyl, substituted or unsubstituted aryl or heteroaryl, substituted or unsubstituted cycloalkyl, aralkyl, ester, ether, alkoxy, alkylthio, or thioalkyl.

The dielectric layer or encapsulation layer may be formed by, for example, such processes as sputter coating, atomic layer deposition, dip coating, spin coating, Langmuir-Blodgett deposition, electrospray ionization, direct nanoparticle deposition, vapor deposition, chemical deposition, vacuum filtration, flame spray, electrospray, spray deposition, electrodeposition, screen printing, close space sublimation, nano-imprint lithography, in situ growth, microwave assisted chemical vapor deposition, laser ablation, arc discharge, gravure printing, doctor blading, spray-coating, slot die coating, or chemical etching.

In some embodiments, the electronic device is a transistor and comprises gate, drain, and source electrodes. The electrodes can comprise any conducting material—including for example, metals, conducting semi-metals, or conducting non-metals. For example, in some embodiments, an electrode may comprise a metal or combination of metals in the form of a coating, wire, sheet, ribbon, micro- or nanoparticle, or mesh. Electrodes may be formed via such processes as sputter coating, atomic layer deposition, dip coating, spin coating, Langmuir-Blodgett deposition, electrospray ionization, direct nanoparticle deposition, vapor deposition, chemical deposition, vacuum filtration, flame spray, electrospray, spray deposition, electrode deposition, screen printing, close space sublimation, nano-imprint lithography, in situ growth, microwave assisted chemical vapor deposition, laser ablation, arc discharge, gravure printing, doctor blading, spray-coating, slot die coating, or chemical etching.

In some embodiments, the article further comprises an anti-glare layer, an anti-smudge layer, a self-cleaning layer, an anti-reflection layer, an anti-fingerprint layer, an optically scattering layer, an anti-splintering layer, and combinations thereof. Such layers may be incorporated through any number of known processes, such as those disclosed in U.S. Patent Publ. Nos. 2011/0129665, 2009/0197048, 2009/

0002821, 2011/0267697, 2011/0017287, or 2011/0240064, herein incorporated by reference.

Another aspect comprises methods of forming embodiments, comprising: providing a glass substrate having a first surface and a second surface; providing an organic semiconductor layer; providing a dielectric layer; and providing at least one electrode. As noted above, it is possible via a number of processes, all incorporated herein, to provide the various elements described. In some embodiments, providing an organic semiconductor layer comprises coating the strengthened glass substrate with the organic semiconductor layer and coating the organic semiconductor layer with the dielectric layer. In some embodiments, providing a dielectric layer comprises coating the glass substrate with the dielectric layer and coating the dielectric layer with the organic semiconductor layer.

EXAMPLES

Example 1: Gate Dielectric Containing Photo-Curable Polymer with Epoxide Functional Group A bisepoxide, Synasia S-06E,

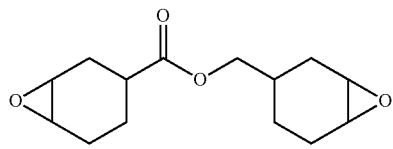 [SMILES: O=C(OCC1CCC2OC2C1)C1CCC2OC2C1]

is combined with propyleneglycol monomethyl ether acetate and Aceto CPI 6976, a cationic photoinitiator composed of a mixture of triarylsulfonium hexafluoroantiminate salts. The composition, in weight percent, is:

| Formulation 1 (ELN0402-1-1) | |
|---|---|
| Component | Wt % |
| Synasia S-06E (Filter 0.45 μm, PTFE) | 18.0 |
| Aceto CPI6976 | 0.045 |
| Propyleneglycol monomethyl ether acetate | 78.0 |

The gate dielectric is formed from the resulting polymer by spin casting at 1200 rpm for 30 s on a 2" Si wafer and pre-baking the wafer in a CEE® WAFER BAKE for 60 s at 90° C. and exposing to UV radiation (ORIEL) at 500, 2000, or 4000 mJ/cm$^2$. The wafer is then baked for 5, 15, or 30 min at 140° C. Nine samples total are made—one at each radiation exposure and bake time. The resulting wafers are soaked in propylene glycol monomethyl ether acetate ("PGMEA") for 5 min and then rubbed with a cotton swab to observe film integrity. Any film removal constitutes film failure. Any wafers that pass the initial test are re-tested by soaking in PGMEA for 5 min and subsequent rubbing with a cotton swab. If necessary, a third iteration of the swab test is done after soaking in PGMEA for 30 min.

The resulting samples all cure well with no difference discernible between the samples. It appears that 500 mJ/cm$^2$ with the UV source and a 5 min 140° C. post-bake is sufficient to provide an excellent cure. Additional data suggests that a 1 min post-bake is sufficient.

The C-V curve of a metal-insulating-semiconductor ("MIS") structure formed from Formulation 1 is shown in FIG. 1. A 347 nm thick dielectric of Formulation 1 is formed on n++ Si by spin casting at 1000 rpm, pre-baking at 100° C. for 60 s, exposing the sample to 2000 mJ/cm$^2$ exposure, and post-baking at 140° C. for 1 min. A 250 nm thick Al electrode is sputtered and patterned on the substrate by typical lithographic methods. The C-V curve shows a moderate hysteresis of 6 V and trapping states near valance band and conduction band edges.

Example 2: Synthesis of Photo-Curable Epoxide Group Containing Co-Polymers

By varying the level of glycidyl methacrylate used in the co-polymer recipes, the degree of crosslinking of the materials can be adjusted. Alternatively, by varying the acrylic or styrenic co-monomer, the surface characteristics (and compatibility with OSC material) can be varied (see general synthesis procedure, supra). The polymers can also be crosslinked by mixing with one or more additional epoxide group containing polymers or lower molecular weight polyepoxy materials. Example 2 provides examples of how variation in the co-monomer affects the resulting dielectric material.

1. Synthesis of Copolymer PGMA-Co-PMMA (1:1) (Scheme 1):

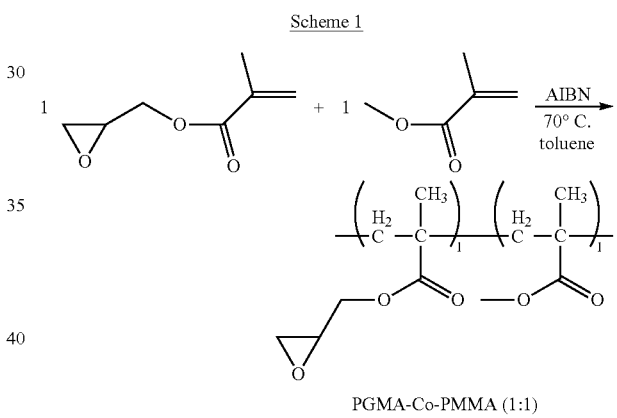

To a round-bottom flask, glycidyl methacrylate (34.16 g, 240.29 mmol), methyl methacrylate (24.06 g, 240.29 mmol), 58.22 g of toluene, and 2.33 g of AIBN are added. The resulting solution is heated to around 65° C. and maintained at that temperature overnight. The whole reaction mixture becomes gelled and is dissolved in 60 mL of methylene chloride. The resulting clear solution is added to a stirred hexane solution to precipitate out the desired product as a white powder. This white powder is further purified by being re-dissolved in THF and being precipitated out in MeOH. The purified product PGMA-Co-PMMA (1:1) is obtained as an off-white solid (48.73 g, 84%). $^1$H NMR (300 MHz, CD$_2$Cl$_2$): δ 4.29 (broad d, 1H), 3.85-3.71 (m, 1H), 3.58 (s, 3H), 3.26-3.14 (m, 1H), 2.86-2.78 (m, 1H), 2.66-2.58 (m, 1H), 2.12-0.77 (m, 10H). GPC (THF): Mn=13,722; Mw=30,060; PDI=2.19. This polymer is very soluble in THF and CH$_2$Cl$_2$ and it is also fully soluble in 5%/10% (wt %) (–)-ethyl-lactate/PGME—a common solvent for photo-curing studies. The polymer is insoluble in toluene and hexane. This polymer in suitable formulation is photo-curable and patternable.

2. Synthesis of Copolymer PGMA-Co-GPPS (1:1) (Scheme 2):

Scheme 2

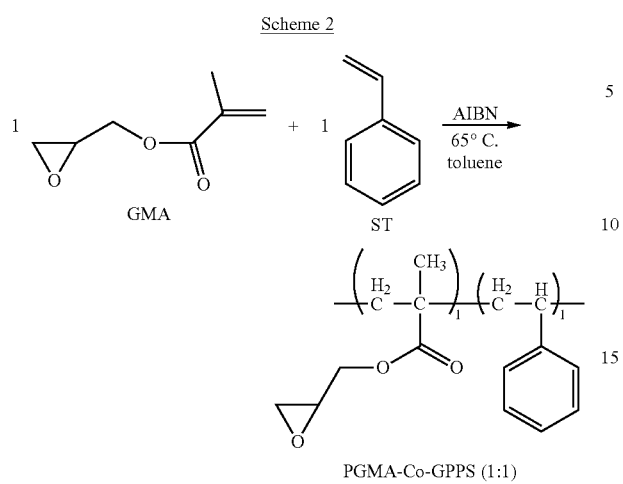

PGMA-Co-GPPS (1:1)

To a round-bottom flask, glycidyl methacrylate (22.04 g, 212 mmol), styrene (30.08 g, 212 mol), 52.12 g of toluene, and 2.08 g of AIBN are added. The resulting solution is heated to around 65° C. and maintained at that temperature overnight. The whole reaction mixture became gelled and is dissolved in 60 mL of methylene chloride. The resulting clear solution is added to a stirred hexane solution to precipitate out the desired product as a white powder. This white powder is further purified by being re-dissolved in THF and being precipitated out in MeOH. The purified product PGMA-Co-GPPS (1:1) is obtained as an off-white solid (48.73 g, 84%). $^1$H NMR (300 MHz, $CD_2Cl_2$): δ 7.4-6.6 (m, 5H), 4.4-0.3 (m, 13H). GPC (THF): Mn=15,126; Mw=34,398; PDI=2.27. This polymer is soluble in THF and $CH_2Cl_2$ and it is also fully soluble in 5%/10% (wt %) (−)-ethyl-lactate/PGME—a common solvent for photo-curing studies. The cured polymer is insoluble in toluene. This polymer in suitable formulation is photo-curable and patternable.

Example 3: Gate Dielectric Formulation Containing Internally Synthesized PGMA-Co-PMMA Polymer PGMA-CO-PMMA is combined with Propyleneglycol monomethyl ether acetate along with Aceto CPI6976, a cationic photoinitiator composed of a mixture of triarylsulfonium hexafluoroantiminate salts (Formulation 2).

| Formulation 2 | |
| --- | --- |
| Component | Wt % |
| PGMA-CO-PMMA (Filter 0.45 μm, PTFE) or PGMA-Co-GPPS | ~18.0 |
| Aceto CPI6976 | 0.045 |
| Propyleneglycol monomethyl ether acetate | 78.0 |

The gate dielectric is formed from the polymers shown in Example 2 by the method shown in Example 1. Both copolymer PGMA-Co-PMMA (1:1) (Scheme 1) and copolymer PGMA-Co-GPPS (1:1) (Scheme 2) cure well in the formulated solution and smooth gate dielectric films are obtained for each.

Example 4: Gate Dielectric Formulation Containing Commercially-Available Photo-curable Organic Polymeric Materials with Epoxide Functional Groups Poly[(2-oxiranyl)-1,2-cyclohexanediol]-2-ethyl-2-(hydroxymethyl)-1,3-propanediol ether ("Daicel EHPE3150", Scheme 3) is combined with Daicel GT-401, a low molecular weight tetraepoxide shown in Scheme 3:

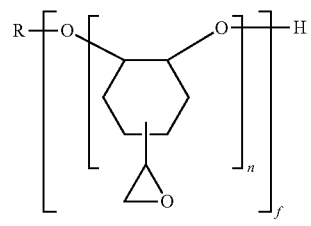

Daicel EHPE3150

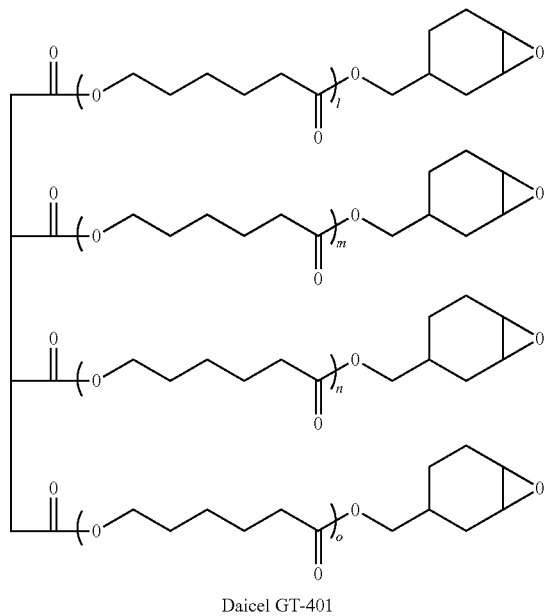

Daicel GT-401 along with Irgacure PAG 290, a cationic photoinitiator composed of a mixture of triarylsulfonium hexafluoroantiminate salts (Formulation Table 1).

| | Component (Wt %) | | | |
| --- | --- | --- | --- | --- |
| | A (Wt %) (batch 2) | B (Wt %) | C (Wt %) | D (Wt %) |
| Daicel EHP3150 (EEW17) | 10% | 8% | 6% | 4% |
| Daicel GT-401 (EEW 222) | 2% | 1.6% | 1.2% | 0.8% |
| Irgacure PAG 290 | 0.12% | 0.096% | 0.072% | 0.048% |
| Baker BTS-220 (PGMEA) | 87.88% | 90.304% | 92.728% | 95.152% |

EHP3150 and GT-401 are dissolved in PGMEA in a brown 125 mL PP Nalgene vessel using an acoustic mixer at 30% for 3 min. The vessel is then placed on lab rollers and allowed to roll overnight (16+ hours). Subsequently, the photoinitiator is added and dissolved using an acoustic mixer at 30%. The resulting product is filtered through a Whitman 25 mm, GD/X, 0.2 μm PTFE, PP housing into an EPA cleaned amber glass bottle.

The MIS samples for C-V measurements are prepared as follows. An n++Si substrate is stripped with 6:1 BOE, treated with UV ozone and subsequently coated with 150 nm thick epoxide gate insulator. The epoxide layer is pre-baked for 1 minute on a 90° C. hot plate (to remove solvent), followed by a 300 s exposure at 18 mW/cm$^2$ using a broad band light source, and then is baked for 5 min on a 140° C. hot plate. 250 nm Al source and drain electrodes are deposited and patterned by contact lithography and wet etched in type A Al etchant. C-V performance is then measured to provide the results in Table 2.

TABLE 2

| Sample | Ave. thickness (nm) | Std. Dev. (nm) | Min (nm) | Max (nm) | GOF |
| --- | --- | --- | --- | --- | --- |
| E (402-14-3-b2a) | 455.6 | 65.3 | 387.3 | 605.0 | 0.9988 |
| F (568-1-1) | 326.7 | 50.33 | 273.6 | 439.2 | 0.9988 |
| G (568-1-2) | 231.2 | 33.61 | 195.0 | 302.3 | 0.9985 |
| H (568-1-3) | 147.8 | 21.82 | 123.6 | 191.5 | 0.9991 |
| I (402-14-3-b3) | 427.9 | 71.54 | 349.0 | 578.0 | 0.9987 |

Example 5: OFET Device Prepared Using a Photo-Cured Epoxide Dielectric Polymer

A bottom gate, bottom contact OTFT is designed as follows: a clean Gorilla® Glass substrate is patterned with an Al gate (thickness ~100 nm) then coated via spin casting with EHP3150 (film thickness of ~400 nm) as a gate insulator. The substrate is then pre-baked at 90° C. for 60 s, exposed to UV light (~20 mW/cm$^2$) for 60 seconds, and annealing at 140° C. for 60 min in air. After annealing, a lift-off Au source and drain (~40 nm thick) is patterned, then the organic semiconductor material, PTDC16DPPTDC17FT4, is spin cast onto the device. This OSC layer is annealing at from about 150° C.–190° C. for 40 min to provide the final OTFT. Output is shown in FIG. 1.

Example 6: Bottom-Gate, Bottom Contact OTFT

Figure 2:
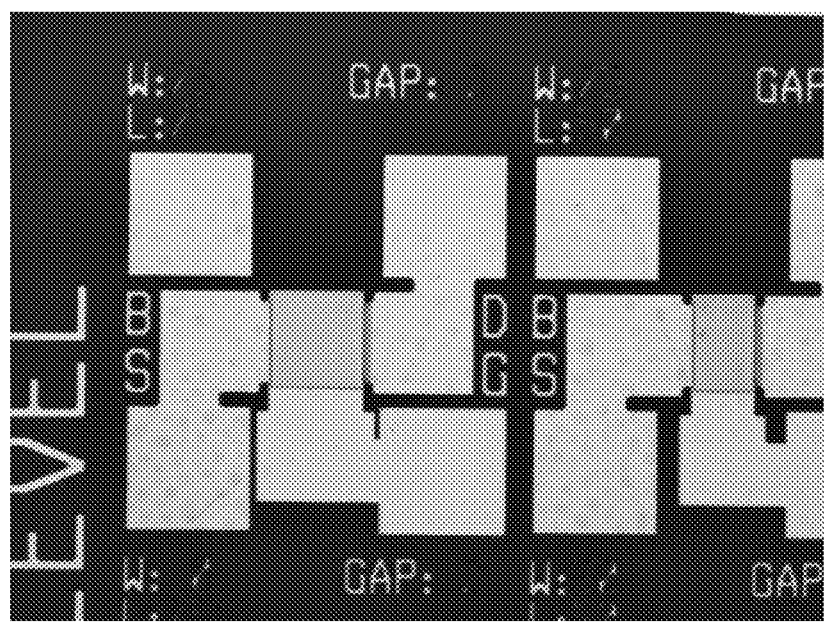
FIG. 2 is an optical micrograph (100× magnification) of a bottom gate, bottom contact TFT on PEN substrate using an epoxide dielectric as described herein for both the gate insulator and passivation layers, along with a fused thiophene organic semiconductor.
Figure 3:
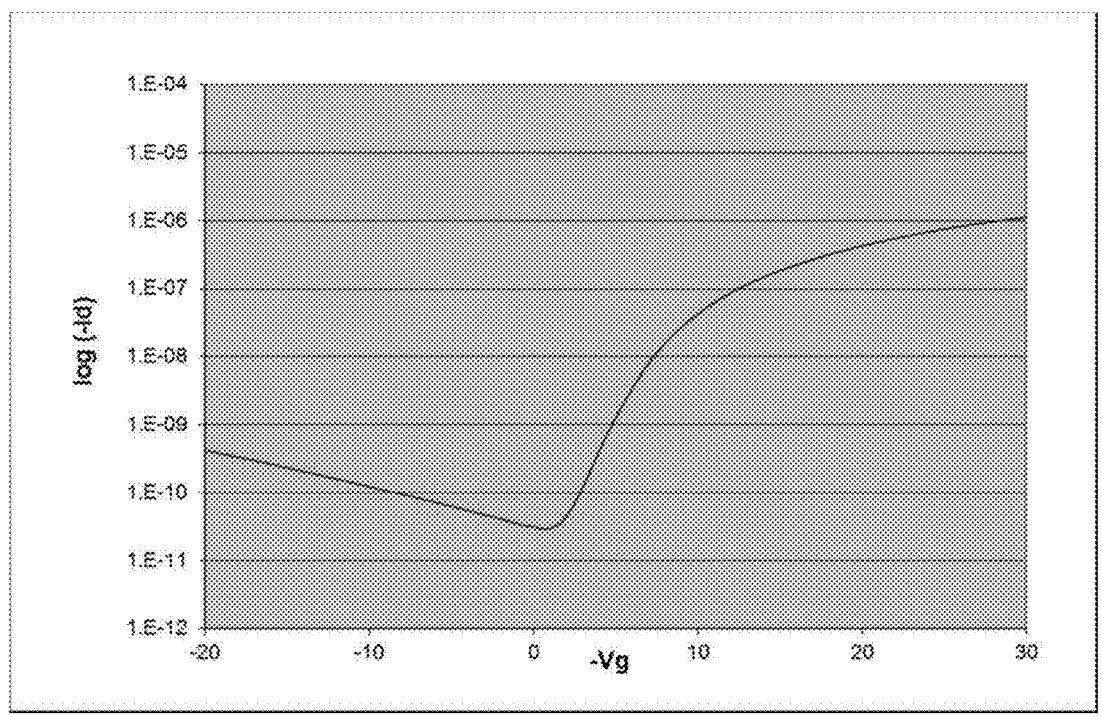
FIG. 3 shows the forward and reverse sweeps of $I_d$ vs. $V_g$ for the TFT on PEN shown in FIG. 2.
Figure 4:
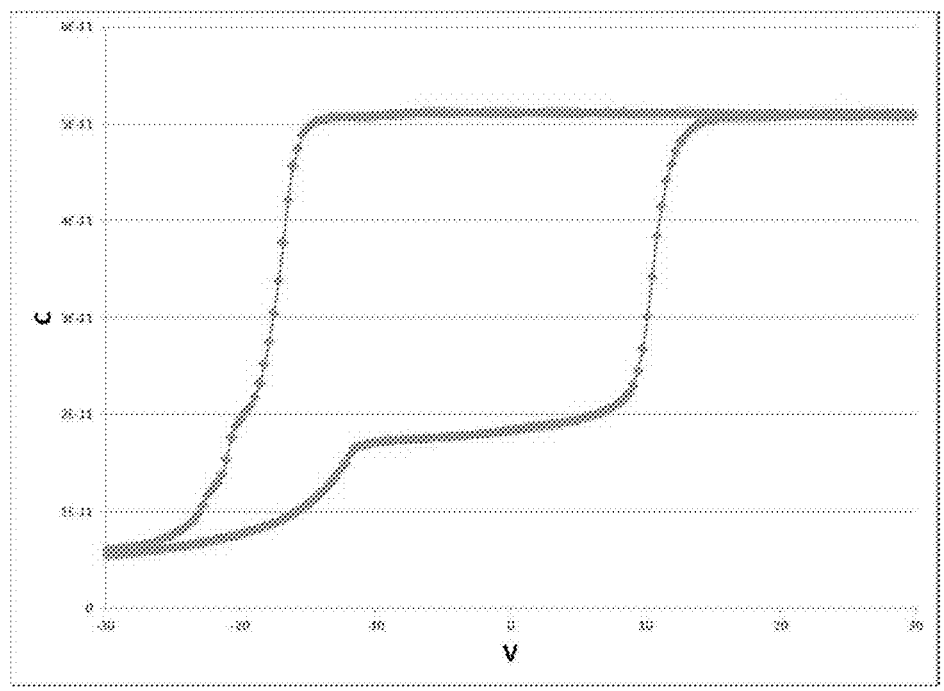
FIG. 4 is a cyclic voltammogram (C-V) of Sample D.

A substrate consisting of PEN laminated to a glass carrier is coated with 150 nm epoxide (Sample H) gate insulator for planarization. The epoxide layer is cured by 300 s exposure at 18 mW/cm$^2$ using a broad band light source, followed by a post bake of 10 min on a 120° C. hot plate. A 100 nm Al gate is sputter deposited and patterned by contact lithography and wet etched in type A Al etchant. A second epoxide gate insulator layer is spun and cured as above. Ag source/drain is formed by sputter deposition of 100 nm Ag followed by contact lithography and wet etch in Transcene TFS Ag etchant diluted 1:1 in pH 10 buffer. Following an HMDS vapor prime at 120° C., a solution of Corning Incorporated's OSC polymer (PTDC16DPPTDC17FT4) at 5 mg/mL in 6:4 decalin:toluene is spin cast and annealed at 120° C. for 60 min in vacuum. After a brief (5 s) low power O$_2$ plasma treatment to improve adhesion, a third epoxide layer is spin cast as a passivation layer. This is photo-patterned by exposing the device to UV radiation for 2.5 s at 18 mW/cm$^2$, post baking at 150° C. for 1 min, and developing in PGMEA followed by IPA and DI rinses. The patterned passivation layer is used to mask the channel. Channel patterning is accomplished by RIE using Ar—CHF$_3$—O$_2$ (FIG. 2). OTFT performance is I$_{on}$/I$_{off}$~10$^4$, saturation mobility 0.02 cm$^2$/V·s with no hysteresis showing in TFT transfer curves (FIG. 3). Devices made with same process, except channel patterned by RIE with conventional photoresist (subsequently removed), exhibit ~5 V hysteresis in transfer curves.

We claim:

1. A formulation comprising:
a photo-curable organic polymeric material, a cationic photoinitiator, and propylene glycol monomethyl ether acetate, wherein the photo-curable organic polymeric material has epoxide functional groups.

2. The formulation of claim 1, wherein the photo-curable organic polymeric material has an amount of 4.8 wt %~12 wt %, the cationic photoinitiator has an amount of 0.048 wt %~0.12 wt %, and propylene glycol monomethyl ether acetate has an amount of 87.88 wt %~95.152 wt %, based on the total weight of the formulation.

3. The formulation of claim 1, wherein the photo-curable organic polymeric material comprises poly [(2-oxiranyl)-1,2-cyclohexanediol]-2-ethyl-2-(hydroxymethyl)-1,3-propanediol ether and a low molecular weight tetraepoxide both.

4. The formulation of claim 3, wherein the poly[(2-oxiranyl)-1,2-cyclohexanediol]-2-ethyl-2-(hydroxymethyl)-1,3-propanediol ether has an amount of 4 wt %~10 wt %, based on the total weight of the formulation.

5. The formulation of claim 3, wherein the low molecular weight tetraepoxide is

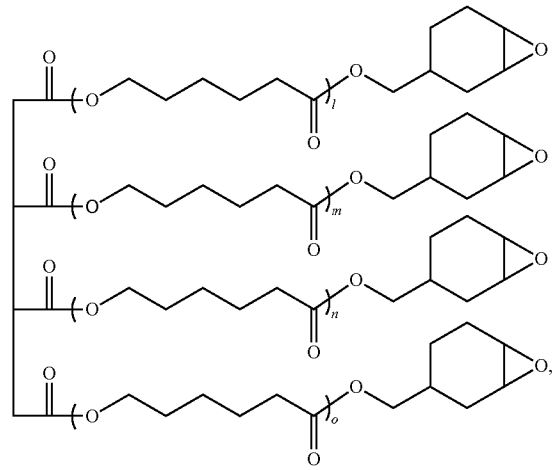

having an amount of 0.8 wt %~2 wt %, based on the total weight of the formulation.

6. The formulation of claim 1, wherein the cationic photoinitiator is composed of a mixture of triarylsulfonium hexafluoroantiminate salts.

7. A dielectric layer comprising the formulation of claim 1.

8. An article comprising:
a substrate having a first surface and a second surface;
an organic semiconductor layer;
a gate, a source, and a drain electrode; and
a dielectric layer,
wherein the dielectric layer is the dielectric layer of claim 7.

* * * * *

UNITED STATES PATENT AND TRADEMARK OFFICE
CERTIFICATE OF CORRECTION

PATENT NO. : 10,680,192 B2
APPLICATION NO. : 16/223645
DATED : June 9, 2020
INVENTOR(S) : Robert Alan Bellman et al.

It is certified that error appears in the above-identified patent and that said Letters Patent is hereby corrected as shown below:

On the Title Page

On page 2, in Column 2, item (56), Other Publications, Line 2, delete "(Methyl" and insert -- Methyl --, therefor.

In the Claims

In Column 24, Line 55 (approx.), Claim 6, delete "hexafluoroantiminate" and insert -- hexafluoroantimonate --, therefor.

Signed and Sealed this
Twentieth Day of September, 2022

Katherine Kelly Vidal
*Director of the United States Patent and Trademark Office*